United States Patent
Lev et al.

(10) Patent No.: US 8,427,329 B2
(45) Date of Patent: Apr. 23, 2013

(54) METHOD OF TESTING AND MONITORING JOINT HEALTH

(75) Inventors: Leonid C. Lev, West Bloomfield, MI (US); Nikolay Kondratyev, West Bloomfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 198 days.

(21) Appl. No.: 13/104,121

(22) Filed: May 10, 2011

(65) Prior Publication Data

US 2012/0286945 A1 Nov. 15, 2012

(51) Int. Cl.
*G08B 21/00* (2006.01)

(52) U.S. Cl.
USPC ... 340/635; 340/438; 340/636.1; 340/636.15; 340/636.19; 702/57

(58) Field of Classification Search .................. 340/635
See application file for complete search history.

(56) References Cited

U.S. PATENT DOCUMENTS

| 6,225,810 B1 * | 5/2001 | Godo et al. .................. 324/525 |
| 2010/0045303 A1 * | 2/2010 | Williams ..................... 324/551 |
| 2011/0004429 A1 * | 1/2011 | Morita et al. .................. 702/63 |
| 2011/0274964 A1 * | 11/2011 | Tuffile .......................... 429/156 |

OTHER PUBLICATIONS

Sun, Guo, "High-cycle fatigue damage measurement based on electrical resistance change considering variable electrical resistivity and uneven damage," International Journal of Fatigue, 2004, pp. 457-462, vol. 26, Hangzhou, China.

* cited by examiner

*Primary Examiner* — Kerri McNally
(74) *Attorney, Agent, or Firm* — Quinn Law Group, PLLC

(57) ABSTRACT

A method for non-destructive health monitoring of a joined component includes: supplying a first current between a first end of a first member and a first end of a second member of the joined component; measuring a first voltage between a second end of the first member and a second end of the second member, wherein the first ends of the first member and the second member are situated opposite of at least one joint from the second ends of the first member and the second member; calculating a first joint resistance of the at least one joint from the supplied first current and the measured first voltage; comparing the calculated first joint resistance to a predetermined minimum joint resistance; and comparing the calculated first joint resistance to a predetermined maximum joint resistance, wherein the predetermined maximum joint resistance is greater than the predetermined minimum joint resistance.

18 Claims, 5 Drawing Sheets

METHOD OF TESTING AND MONITORING JOINT HEALTH

TECHNICAL FIELD

This disclosure relates generally to testing and monitoring of joints and joint quality.

BACKGROUND

Many devices are assembled or manufactured with joints linking two or more components. Vehicles, and especially hybrid and hybrid-electric vehicles, include batteries for storage of electrical energy. The rechargeable battery or batteries may provide power used for vehicle traction. Furthermore, the batteries may be used to provide power for operation of accessories and for starting, lighting, and ignition functions of the vehicle.

Modern vehicles contain a large number of components. Many of these components contain several sub-component members, jointed or joined together. It is common to refer to a component containing jointed members as a joined component.

SUMMARY

A method for non-destructive health monitoring of a joined component is provided. The method includes supplying a first current between a first end of a first member of the joined component and a first end of a second member of the joined component. The method measures a first voltage between a second end of the first member and a second end of the second member. The first end of the first member and the first end of the second member are oriented or situated opposite of at least one joint from the second ends of the first member and the second member. The method calculates a first joint resistance or effective resistance of the at least one joint from the supplied first current and the measured first voltage, and compares the calculated first joint resistance to a predetermined minimum joint resistance. The method also compares the calculated first joint resistance to a predetermined maximum joint resistance, which is greater than the predetermined minimum joint resistance.

The method further includes outputting a result of the comparison. The result may be one of: a measurement error, if the calculated first joint resistance is below the predetermined minimum joint resistance, a failed joint, if the calculated first joint resistance is above the predetermined maximum joint resistance, and an acceptable joint, if the calculated first joint resistance is above the predetermined minimum joint resistance and below the predetermined maximum joint resistance.

The above features and advantages and other features and advantages of the present invention are readily apparent from the following detailed description of the best modes and other embodiments for carrying out the invention when taken in connection with the accompanying drawings.

DESCRIPTION

Figure 1:
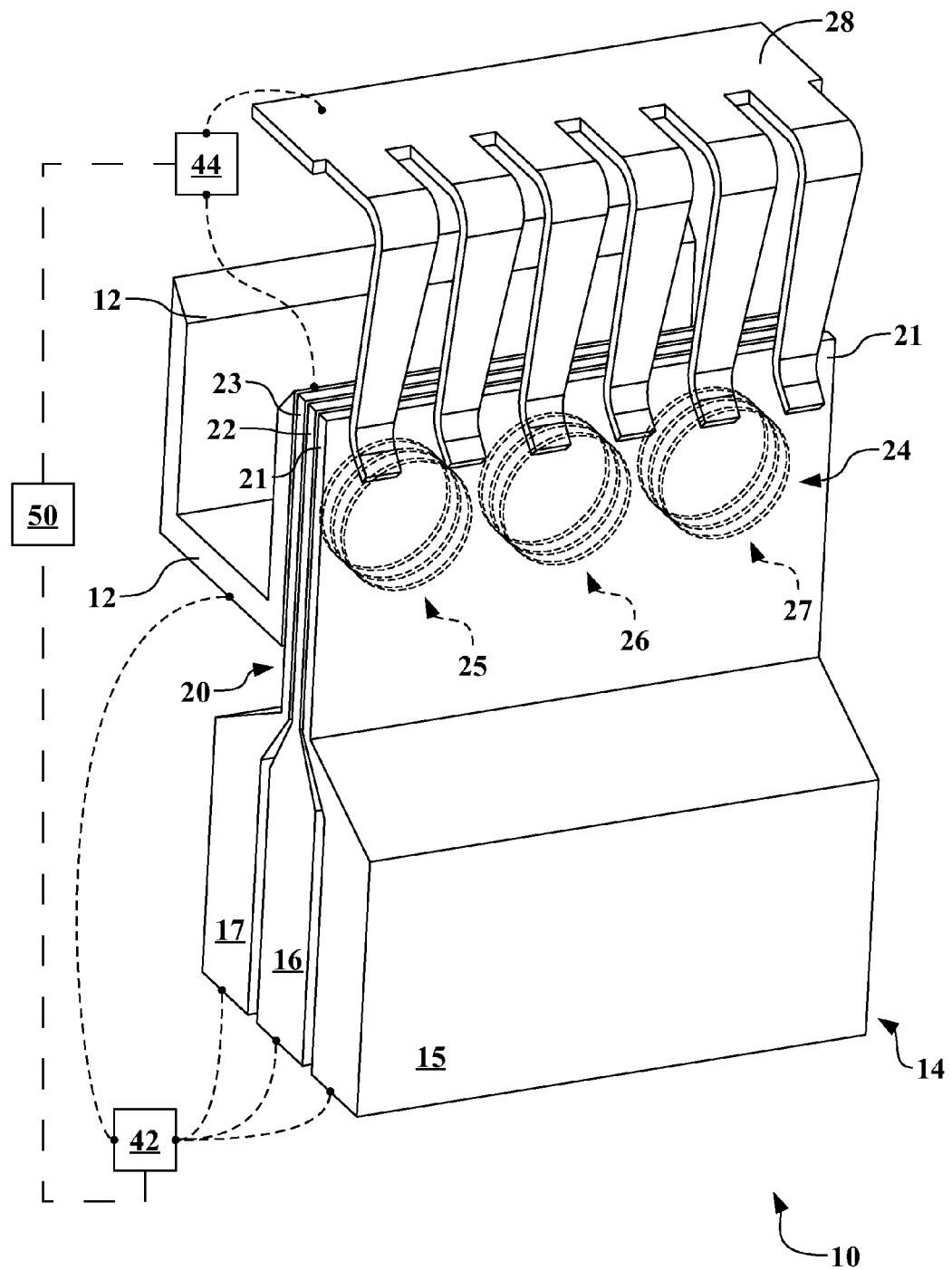
FIG. 1 is a schematic isometric view of a portion of a multi-cell battery, showing three battery cells welded to a bus member.

Referring to the drawings, wherein like reference numbers correspond to like or similar components throughout the several figures, there is shown in FIG. 1 a portion of a multi-cell battery 10 for a vehicle (not shown). The battery 10 includes a plurality of joints between components. Each of the joints includes a plurality of first members or first sides, such as bus members 12 (only one of which is shown in FIG. 1) and a plurality of second members or second sides, such as battery cells 14. The first and second members are on opposing sides of the joint, and designation as first or second is not limiting. The battery cells 14 may be individually denoted as a first cell 15, a second cell 16, and a third cell 17. Features and components shown in other figures may be incorporated and used with those shown in FIG. 1.

The bus member 12 shown may be referred to as a common bus or a U-channel. The whole battery 10, or portions thereof, may alternatively be referred to as a battery pack. Furthermore, each of the first through third cells 15, 16, 17 may be configured to operate as individual batteries, which are then combined and arranged to provide specific characteristics for the battery 10, as required by the specific hybrid or hybrid-electric vehicles into which the battery 10 may be incorporated. As described herein, the attachments for only one side of the bus member 12 are fully shown, and each side of the bus member 12 may be in communication with fewer or more battery cells 14 than shown. The exact configurations of the portion of the battery 10 shown in the figures are illustrative only and do not limit the scope of the invention.

The battery cells 14 are attached to the bus member 12 through a plurality of tabs 20, which are on the second members of the joints. The first, second, and third cells 15, 16, and 17, include a first tab 21, a second tab 22, and a third tab 23, respectively. Each of the battery cells 14 and tabs 20 may be substantially identical, such that any individual battery cell 14 may be designated as first, second, or third.

Electrical connection between the bus member 12 and the tabs 20 occurs through a plurality of weld joints 24. The weld joints 24 are composite joints formed from the individual weld nugget joints. Specific weld joints 24 may be referred to as a first weld stack 25, a second weld stack 26, and a third weld stack 27. More or fewer weld joints 24 may be used to electrically connect the tabs 20 to the bus member 12.

A probe 28 is shown in contact with a portion of the first tab 21 in FIG. 1, and may provide sensing for the weld joint 24. The probe 28 may be permanently installed and remain on the battery 10, or may be attached during vehicle maintenance or service. Additional probes 28 may be placed in contact with additional weld joints 24.

Figure 2A:
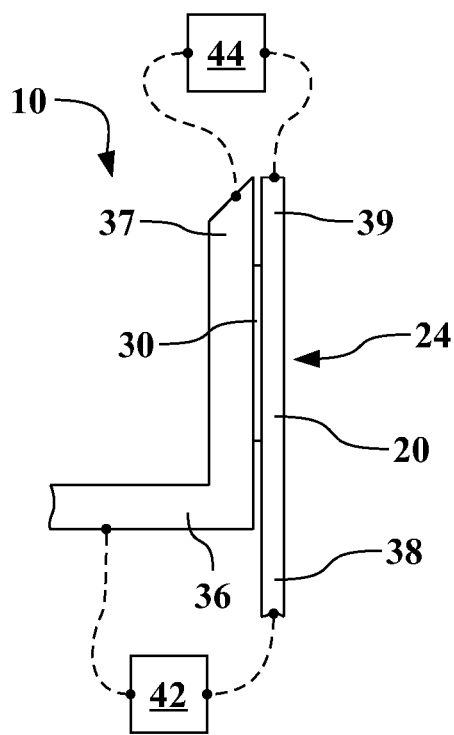
FIG. 2A is a schematic side view of a portion of a battery cell similar to that shown in FIG. 1, but having a single-tab configuration.
Figure 2B:
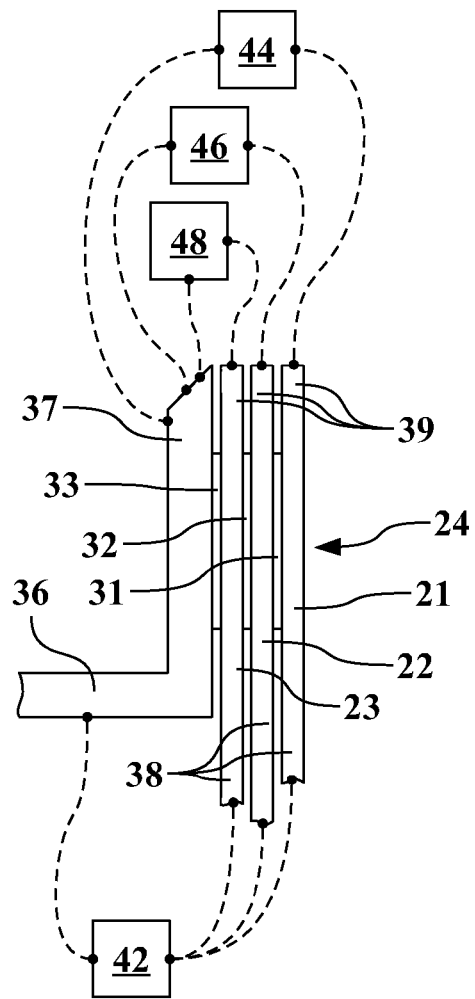
FIG. 2B is a schematic side view of a portion of a battery cell similar to that shown in FIG. 1, and having a three-tab configuration.

Referring now to FIG. 2A and FIG. 2B, and with continued reference to FIG. 1, there are shown two side views of portions of batteries 10 similar to the portion of the battery 10 shown in FIG. 1. FIG. 2A shows a side view of a single-tab configuration in which the tab 20 is welded directly to the bus member 12, such that the weld joint 24 has only one weld nugget 30. FIG. 2B shows a side view of a three-tab configuration in which three tabs 20 are all welded to the bus member 12, such that the weld joint 24 has three weld nuggets 30, a first weld nugget 31, a second weld nugget 32, and a third weld nugget 33. Features and components shown in other figures may be incorporated and used with those shown in FIGS. 2A and 2B.

Although illustrated as separately-identifiable components, the weld nuggets 30 may generally be considered as zones of coalescence between the adjacent tabs 20. Furthermore, adjacent tabs 20 may be pressed together during assembly, such that a side-view would not necessarily show the individual weld nuggets 30 between the tabs 20. The weld nuggets 30 may be of varying thickness and area and may be formed by resistance welding, ultrasonic welding, or other suitable welding processes. The weld nuggets 30, individually, or the weld joints 24 may also be referred to as joints or weld joints. The weld nuggets 30 may be individually measured or checked for joint integrity or the weld joints 24 may be measured for overall joint integrity.

As shown in FIG. 2A, the bus member 12 has a first end 36 and a second end 37, which are disposed on opposing sides of the of the weld nugget 30. Similarly, the tab 20 has a first end 38 and a second end 39, which are also disposed on opposing sides of the of the weld nugget 30. The first end 36 of the bus member 12 and the first end 38 of the tab 20 are on the same relative side of the weld nugget 30.

The battery cell 14 (not shown in FIG. 2A) or the tab 20 is connected to a current source 42, which supplies a current between the first end 36 of the bus member 12 and the first end 38 of the tab 20 via wires or conductors (shown as dashed lines). In order to move between the first end 36 of the bus member 12 and the first end 38 of the tab 20, the current moves through the weld nugget 30. The current source 42 may include a voltage source and a precision resistor. Therefore, the current source 42 may also supply a voltage at a controlled resistance between the first end 26 of the bus member 12 and the first end 38 of the tab 20. A first voltmeter 44 measures a voltage differential between the second end 37 of the bus member 12 and the second end 39 of the tab 20.

A control system 50 is in communication with at least the current source 42 and the first voltmeter 44. The control system 50 may include one or more components with a storage medium and a suitable amount of programmable memory, which are capable of storing and executing one or more algorithms or methods to effect the methods or processes described herein. The control system 50 may be in communication with additional sensors and communication systems of the vehicle. Each component of the control system may include distributed controller architecture, such as a microprocessor-based electronic control unit (ECU). Additional modules or processors may be present within the control system 50. The control system 50 may include, or be in communication with a separate receiver or a communications path.

The control system 50 may be configured with, or may include, a counter. Therefore, the control system 50 is configured to count the lapse of time, cycles of operation of the battery 10, or lapse of events of the vehicle into which the battery 10 is incorporated.

From the current and the measured voltage, it is possible to calculate the resistance of the weld nugget 30. The calculated resistance may be indicative of the quality of the weld nugget 30. For example, if the weld nugget 30 does not include continuous coalescence between the tab 20 and the bus member 12, flow of the current from the tab 20 to the bus member 12 may be impeded, causing the calculated resistance to increase. Furthermore, if the weld nugget 30 is broken or has significant cracking, the calculated resistance may also increase greatly.

The three-tab configuration shown in FIG. 2B may be the same configuration of the battery 10 as is shown in FIG. 1. The weld joint 24 shown in FIG. 2B includes the first weld nugget 31, the second weld nugget 32, and the third weld nugget 33. The weld joint 24 may be any of the first weld stack 25, the second weld stack 26, and the third weld stack 27 shown in FIG. 1.

The first tab 21 has a first end 38 and a second end 39, which are disposed on opposing sides of the of the first weld nugget 31. The first end 36 of the bus member 12 and the first end 38 of the first tab 21 are on the same relative side of the first weld nugget 31. Similarly, the second tab 22 has a first end 38 and a second end 39 disposed on opposing sides of the of the second weld nugget 32, and the third tab 23 has a first end 38 and a second end 39 disposed on opposing sides of the of the third weld nugget 33.

The current supply 42 is connected to the first ends 38 of the first tab 21, the second tab 22, and the third tab 23. A first current ($I_1$) is supplied by the current supply 42 between the first end 36 of the bus member 12 and the first end 38 of the first tab 21. Similarly, a second current ($I_2$) is supplied by the current supply 42 between the first end 36 of the bus member 12 and the first end 38 of the second tab 22, and a third current ($I_3$) is supplied by the current supply 42 between the first end 36 of the bus member 12 and the first end 38 of the third tab 23. The first current, the second current, and the third current may be substantially equal, such that each is approximately one-third of a total stack current (I) supplied by the current supply 42.

$$I_1=I_2=I_3=I/3$$

The first voltmeter 44 measures a first voltage ($V_1$) between the second end 37 of the bus member 12 and the second end 39 of the first tab 21. A second voltmeter 46 is attached to the second end 37 of the bus member 12 and the second end 39 of the second tab 22, and measures a second voltage ($V_2$) therebetween. A third voltmeter 48 is attached to the second end 37 of the bus member 12 and the second end 39 of the third tab 23, and measures a third voltage ($V_3$) therebetween.

Electrical current in metallic conductors is realized through flow of electrons. Ohm's law states that the current through a conductor between two points is directly proportional to the potential difference across the two points. The coefficient of proportionality is an inverse of the resistance between the two points.

The current in metallic conductors usually obeys Ohm's law. Therefore, the ratio of the voltage to current applied to a metallic conductor or set of conductors, caused by this voltage, is constant and may be called the effective resistance of the set of conductors to the voltage or current applied.

From the total stack current and from the measured first, second, and third voltages, the resistance of each of the first, second, and third weld nuggets 31, 32, 33 may be calculated. A first nugget resistance ($R_{12}$) is the resistance of only the first weld nugget 31 between the first tab 21 and the second tab 22. A second nugget resistance ($R_{23}$) is the resistance of only the second weld nugget 32 between the second tab 22 and the third tab 23. A third nugget resistance ($R_{3b}$) is the resistance of only the third weld nugget 33 between the third tab 23 and the bus member 12. The first, second, and third nugget resistances can be determined or calculated as three unknowns in three equations.

$$V_1 = I*(1/3*R_{12} + 2/3*R_{23} + R_{3b})$$

$$V_2 = I*(2/3*R_{23} + R_{3b})$$

$$V_3 = I*(R_{3b})$$

Therefore, the resistance of the each of the three joints formed by the first weld nugget 31, the second weld nugget 32, and the third weld nugget 33 may be determined. The individual resistances of each of the first weld nugget 31, the second weld nugget 32, and the third weld nugget 33 may be compared to a quality range. The weld quality range may have a predetermined minimum nugget resistance or a predetermined minimum joint resistance, and may have a predetermined maximum nugget resistance or a predetermined maximum joint resistance.

The results of the comparison may then be output to a receiver, which may be, for example and without limitation: a computer logging data, an operator testing the battery 10 or portions thereof, or an automated testing and sorting process. The specific values of the weld quality range may vary greatly based upon the type of battery 10, the materials used for the tabs 20, and the type of welding process used to create the weld nuggets 30 and the weld joints 24.

The results of the comparisons may include, for example and without limitation: a measurement error, a failed joint, and an acceptable joint. When the measured joint is a welded joint, the results of the comparisons may include, for example and without limitation: a measurement error, a failed weld, and an acceptable weld.

The measurement error result may be output if the calculated first resistance is below the predetermined minimum nugget resistance. While low resistance generally indicates a better-quality weld, it may be assumed that below the predetermined minimum resistance there is a testing error because even welds of the best quality cannot reduce resistance below, for example, the resistance of the solid materials used.

The failed joint or failed weld result may be output if the calculated first resistance is above the predetermined maximum nugget resistance, indicating that the weld quality is low and current is having difficulty flowing through the weld joint 24. The acceptable weld result may be output if the calculated first resistance is above the predetermined minimum nugget resistance and below the predetermined maximum nugget resistance such that the resistance falls within the weld quality range.

Comparison of the individual resistances may reveal problems in manufacturing or assembly of the battery 10. For example, and without limitation, after several tests and comparisons, it may be determined that the third weld nugget 33 is often improperly formed, and the welding process may be adjusted accordingly.

In addition to solving the three equations for the resistance of each of the individual nuggets, the parenthetical quantities may be determined as resistance constants for portions of the weld joint 24. A first weld stack resistance (R1) is the total resistance of the weld joint 24, and may be indicative of the total quality of the weld joint 24 as a whole. The resistance constant for the weld joint 24 is not the resistance of any specific element, but is the total effective resistance between the first tab 21 and the bus member 12.

$$V_1 = I*(R_1)$$

If measuring only a single weld nugget (i.e., a single weld joint), the joint resistance may simply be a measured resistance in ohms. However, when multiple components have multiple individual welds within the whole joint, such as with the weld joint 24, the ratio of voltage to current provides the resistance constant of the whole joint. The resistance constant may also be referred to as the effective resistance, and is the ratio of the first voltage to the total stack current. As used herein, "joint resistance" may refer to actual resistance of a single joint between two components or may refer to the effective resistance of multiple joints between multiple components, as measured by the ratio of voltage to current.

A weld quality range may also be applied to the resistance constant for the whole weld joint 24, such that the first weld stack resistance is compared to a predetermined minimum stack resistance and a predetermined maximum stack resistance. The individual resistances of the first, second, and third weld nuggets 31, 32, 33 may help identify specific manufacturing flaws. The resistance constant for the whole weld joint 24, however may help identify successful assembly of that portion of the battery 10 for quality control. It may be that each of the weld joints 24 needs to function for the battery 10 to clear inspection. In such a case, it may be irrelevant which of the weld nuggets 30 with the weld joint 24 has defaults.

Each of the first weld stack 25, the second weld stack 26, and the third weld stack 27 may have the total current supplied between the first end 38 of the first tab 21 and the first end 36 of the bus member 12. One voltmeter, similar to the first voltmeter 44 shown in FIG. 2B, may be connected to the second ends 39 of the first tab 21, above each of the first through third weld stacks 25-27 and also connected to the second end 37 of the bus member 12.

From the total current supplied below each of the first through third weld stacks 25-27 and from the voltage measured above each of the first through third weld stacks 25-27, the resistance constant may be determined for each of the first through third weld stacks 25-27. Furthermore, the resistance constants of each of the first through third weld stacks 25-27 may be compared to the weld quality range to determine whether the total stack weld quality is within the predetermined range. Because the first through third weld stacks 25-27 represent easier paths for current flow than directly between the un-welded portions of the tabs 20, the tabs 20 may be treated as if they are electrically separate (or have air gaps) between the first through third weld stacks 25-27 when determining the resistance thereof.

Therefore, the second weld stack 26 may have a second measured voltage ($V_2$) and the third weld stack 27 may have a third measure voltage ($V_3$). The resistance of the second weld stack 26 may be calculated as a second stack resistance ($R_2$) and the resistance of the third weld stack 27 as a third stack resistance ($R_3$). The second stack resistance and the third stack resistance are the effective resistance of the respective stacks.

$$V_2 = I*(R_2)$$

$$V_3 = I*(R_3)$$

As shown in FIG. 1, the resistance of the whole weld joint 24 may be determined. The first voltmeter 44 is in communication with the probe 28 and the second end 37 of the bus member 12. By measuring the current flow through the battery cells 14 and the voltage differential ($V_j$) between the second end 37 of the bus member 12 and the probe 28, a resistance constant or effective resistance ($R_j$) for the weld joint 24 may be calculated.

$$V_j = I*(R_j)$$

A weld quality range may also be applied to the resistance constant or effective resistance for the weld joint 24, such that the joint resistance is compared to a predetermined minimum joint resistance and a predetermined maximum joint resistance. The resistance constant or effective resistance for the battery 24 may help identify successful assembly and continuing operation of the weld joint 24.

The calculations above are based upon supplying a known current and calculating the specific resistance constant or effective resistance of the desired component therefrom. However, other techniques may be used to identify and compare resistance characteristics of portions of the battery 10. For example, the current may be supplied from a known voltage ($V_k$) and a known resistance ($R_k$), which may also be represented as the current source 42. A voltage drop ratio of the measured voltage of the weld joint 24 and the known voltage may be determined. Then, from the voltage drop ratio of the measured voltage of the weld joint 24 and the known voltage, the resistance constant or effective resistance for the weld joint 24 may be calculated.

$$R_j = R_k * (V_j/V_k)$$

The resistance constant or effective resistance of the weld joint 24 may then be compared to the predetermined range. Furthermore, the resistance constant of the weld joint 24 may be stored as an initial or a first joint resistance. At a subsequent time, such as during service or maintenance of the vehicle after a calibrated time lapse (which may be anywhere from several months to years later) or a calibrated cycle lapse (such as mileage, vehicle operation cycles, et cetera), the resistance constant of the weld joint 24 may again be calculated and may be stored as a second joint resistance.

The second joint resistance and the first joint resistance may then be compared to determine the change in effective resistance of the weld joint 24 occurring over the time lapse or the cycle lapse. This change in effective resistance may be used to determine or calculate a fatigue lapse of the weld joint 24 during the time lapse or cycle lapse. Fatigue lapse is the calculated estimate of the number of fatigue cycles occurring over the time lapse or cycle lapse. Fatigue may occur in the weld joint 24 due to heating and cooling—and the expansion and contraction caused therefrom—or due to movement of the battery 10 and the vehicle.

From the fatigue lapse and the time lapse or cycle lapse, an estimate of the remaining life of the battery 10—or at least the tested weld joint 24—may be calculated. The remaining life may be determined in remaining fatigue cycles, remaining time, or other values calculated therefrom.

Figure 3:
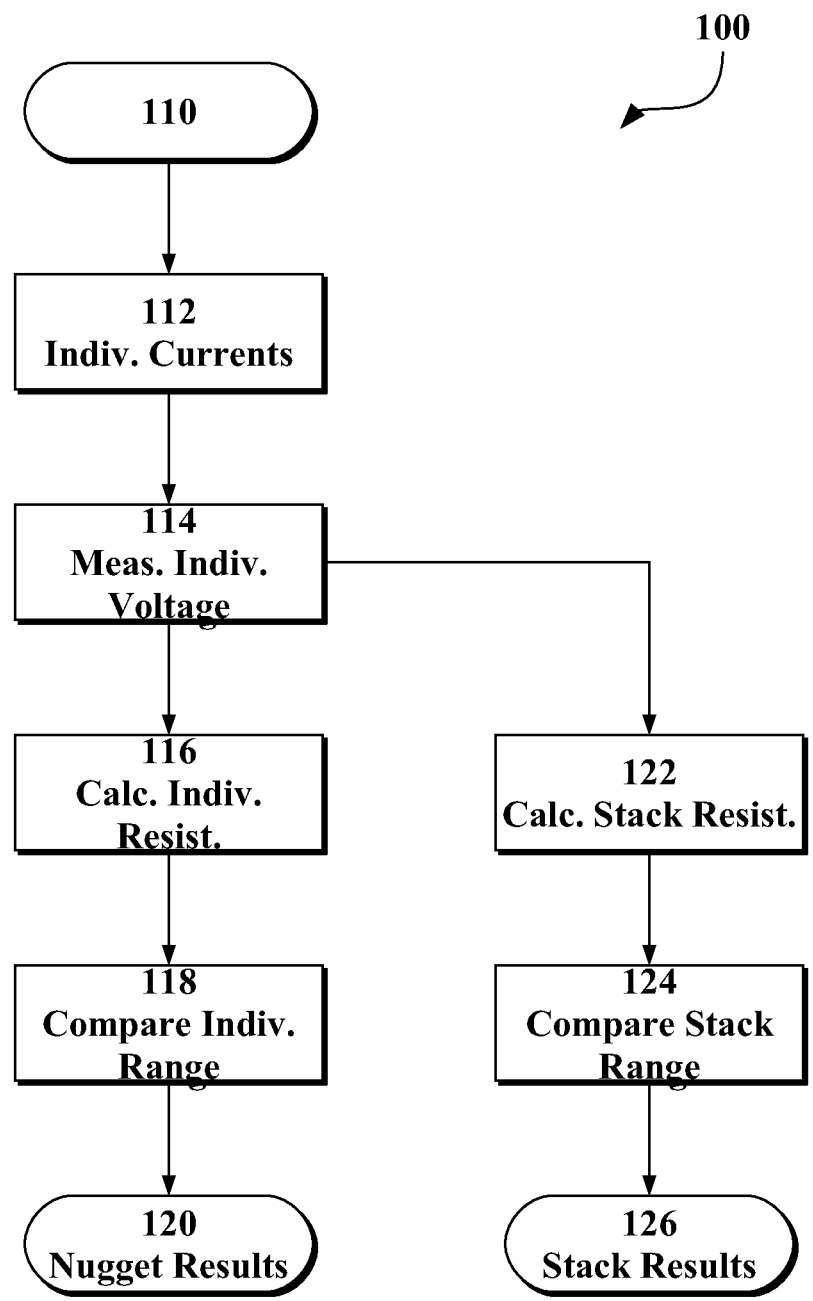
FIG. 3 shows a schematic flow chart diagram of an algorithm or method for testing the resistance of welds in a multi-cell battery, such as that shown in FIG. 1.

Referring now to FIG. 3 there is shown a schematic flow chart diagram of an algorithm or method 100 for non-destructive testing of the multi-cell battery 10. The battery 10 is but one illustrative example of a component having joints which may be tested and monitored using the methods described herein. The exact order of the steps of the algorithm or method 100 shown in FIG. 3 is not required. Steps may be reordered, steps may be omitted, and additional steps may be included. Furthermore, the method 100 may be a portion or sub-routine of another algorithm or method. FIG. 3 shows only a high-level diagram of the method 100.

For illustrative purposes, the method 100 may be described with reference to the elements and components shown and described in relation to FIG. 1. However, other components may be used to practice the method 100 and the invention defined in the appended claims. Any of the steps may be executed by multiple components within a control system.

Step 110: Start.

The method 100 may begin at a start or initialization step, during which time the method 100 is monitoring operating conditions of the joined component or the testing equipment upon which the joined component is mounted. Initiation may occur in response to a signal from an operator.

Step 112: Supply Individual Currents.

The method 100 includes supplying a first current between a first end of a first member, such as the bus member 12, and the first end of a second member, such as the first tab 20. If the joined component has a single-tab configuration, the first current may be the only current supplied. However, for multi-component or multi-tab configurations, the method 100 also includes supplying the second current between the first end of the first member and the first end of the second tab, and supplying the third current between the first end of the first member and the first end of the third tab. The first current, the second current, and the third current may be substantially equal, such that each is one-third of the total stack current.

Step 114: Measure Individual Voltages.

The method 100 includes measuring the first voltage between the second end of the first member and the second end of the second member. The first ends of the first member and the second member are oriented opposite of the first joint from the second ends of the first member and the second member, and the first ends of the second tab and the third tab are similarly-oriented. The method 100 may also include measuring the second voltage between the second end of the first member and the second end of the second tab, and measuring the third voltage between the second end of the first member and the second end of the third tab.

Step 116: Calculate Individual Joint Resistances.

The method 100 includes calculating a first joint resistance of the first joint from the supplied first current and the measured first voltage. Depending upon the configuration of the joined component, this may be determined directly or may need to be determined in conjunction with calculating the second joint resistance of the second joint from the supplied second current and the measured second voltage and with calculating the third joint resistance of the third joint from the supplied third current and the measured third voltage. If the joints include more than one jointed component therein, the method 100 will be calculating the effective resistances of first, second, and third joints. The three individual resistances of the first, second, and third joints may be determined by solving three equations for the three unknowns.

Step 118: Compare Individual Ranges.

The method 100 includes comparing the calculated first resistance to the predetermined minimum joint resistance and to the predetermined maximum joint resistance. The predetermined maximum joint resistance is greater than the predetermined minimum joint resistance. The second resistance and the third resistance may also be compared to the predetermined minimum joint resistance and to the predetermined maximum joint resistance.

Step 120: Output Joint Results; End.

The method 100 includes outputting the result of the comparison to the receiver. As discussed above, the results may include: measurement error, if the calculated first resistance is below the predetermined minimum joint resistance; failed joint, if the calculated first resistance is above the predetermined maximum joint resistance; and acceptable joint, if the calculated first resistance is above the predetermined minimum joint resistance and below the predetermined maximum joint resistance.

The method 100 may end after outputting the results of the comparison with the joint quality range. The end step may actually be a return to start, or the method 100 may wait until called upon again.

Step 122: Calculate Stack Resistance.

When applied to a battery 10 having a multi-tab configuration, the method 100 may include calculating the weld stack resistance from the supplied total stack current and the measured first voltage. The weld stack resistance is the effective resistance of the whole measured weld stack. The weld stack resistance may be calculated for the first weld stack 25, the second weld stack 26, and the third weld stack 27. Depending upon the configuration of the weld joint 24, the first joint resistance of the weld joint 24 may also be calculated in this step.

Step 124: Compare Stack Range.

The method may include comparing the calculated first weld stack resistance to the predetermined minimum stack resistance and to the predetermined maximum stack resistance. The predetermined maximum stack resistance is greater than the predetermined minimum stack resistance.

Step 126: Output Stack Results; End.

The method 100 includes outputting the result of the comparison of the weld stack resistance and the weld quality range to the receiver. The results may include: measurement error, failed weld, and acceptable weld. The measurement error results if the calculated first weld stack resistance is below the predetermined minimum stack resistance. The failed weld results if the calculated first weld stack resistance is above the predetermined maximum stack resistance. The acceptable weld results if the calculated first weld stack resistance is above the predetermined minimum stack resistance and below the predetermined maximum stack resistance.

Figure 4:
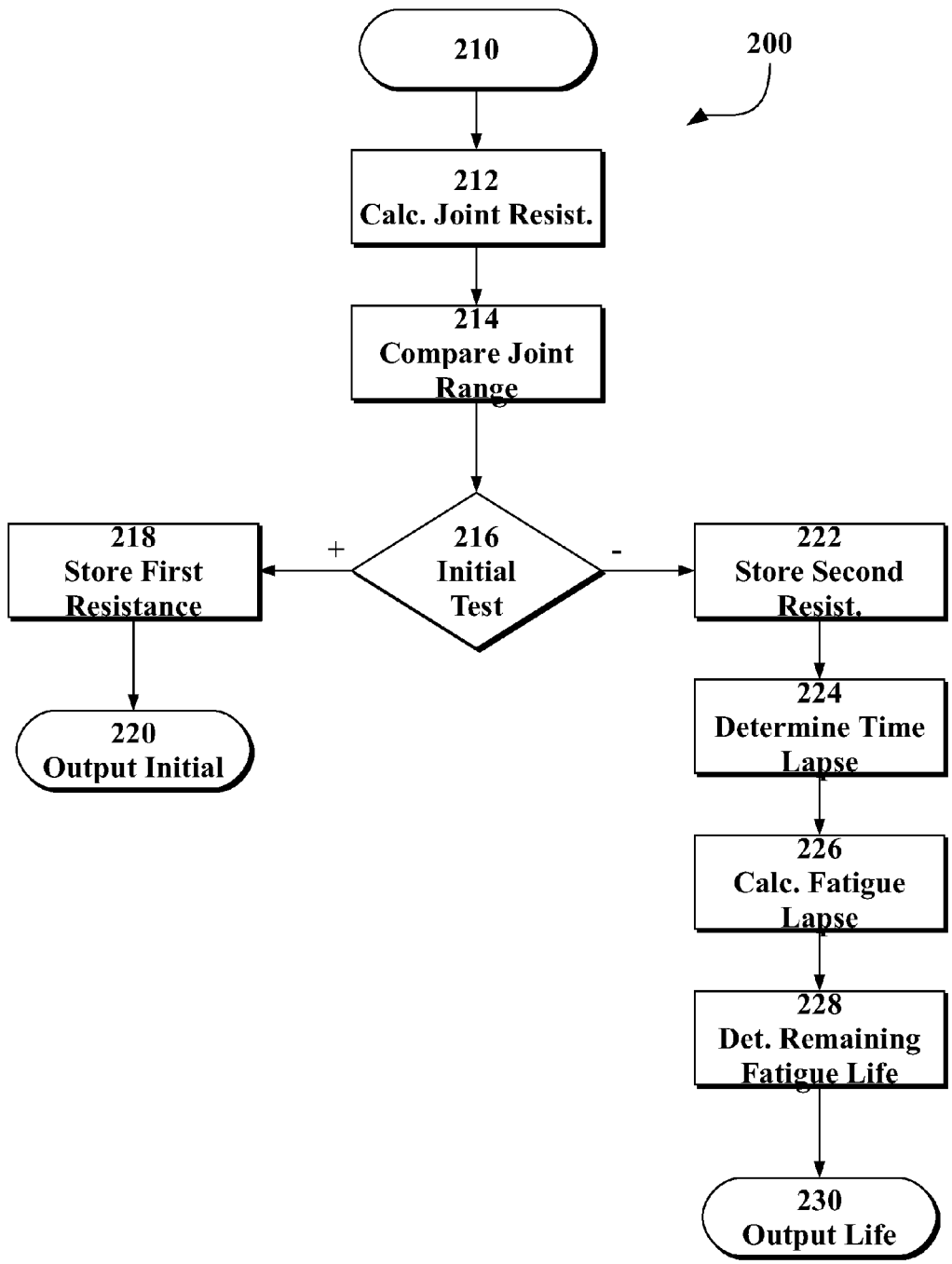
FIG. 4 shows a schematic flow chart diagram of an algorithm or method for monitoring health of welds in a multi-cell battery, such as that shown in FIG. 1.

Referring now to FIG. 4, and with continued reference to FIGS. 1-3, there is shown a schematic flow chart diagram of an algorithm or method 200 for health monitoring of joints. For example, the method 200 may be used to monitor the weld joints of the multi-cell battery 10 shown in FIG. 1. Alternatively, the method 200 may be used to monitor other types of joints, such as mechanical joints.

The exact order of the steps of the algorithm or method 200 shown in FIG. 4 is not required. Steps may be reordered, steps may be omitted, and additional steps may be included. Furthermore, the method 200 may be a portion or sub-routine of another algorithm or method, such as the method 100 of FIG. 3. FIG. 4 shows only a high-level diagram of the method 200.

For illustrative purposes, portions of the method 200 may be described with reference to the elements and components shown and described in relation to FIG. 1. However, other components may be used to practice the method 200 and the invention defined in the appended claims. Any of the steps may be executed by multiple components within a control system.

Step 210: Start.

The method 200 may begin at a start or initialization step, during which time the method 200 is monitoring operating conditions of the battery 10 or the testing equipment upon which the battery 10 is mounted. Initiation may occur in response to a signal from an operator, or as a result of one of the steps of the method 100 shown in FIG. 3.

Step 212: Calculate Joint Resistance.

The method 200 includes calculating the joint resistance of the weld joint 24 from the supplied first current and the measured first voltage. Alternatively, the joint resistance of the weld joint 24 may be calculated from the voltage drop ratio (the measured voltage between the second end 37 of the bus member 12 and the probe 28 divided by the known voltage) and the known resistance. The joint resistance may be the effective resistance or the resistance constant.

The joint resistance of the weld joint 24 may also have been calculated as part of the method 100 shown in FIG. 3. Supplying the current for calculation of the joint resistance may occur during operation of the vehicle. For example, and without limitation, during operation of the vehicle, the battery 10 may be discharging to assist traction and operate accessories or may be charging during regenerative braking.

Step 214: Compare Joint Range.

The method 200 may also include comparing the calculated joint resistance to the predetermined minimum joint resistance and the predetermined maximum joint resistance. Depending upon the configuration of the method 200, there may be an output of the result of the comparison to the receiver. The result may again be one of: measurement error, failed weld, and an acceptable weld.

The method 200 may include testing several of the weld joints 24 within the battery 10, all of the weld joints 24 within the battery 10, or only one of the weld joints 24. From testing and calculation of the resistance of one or more of the weld joints 24, the method 200 may be able to estimate, interpolate, or extrapolate the health of the whole multi-cell battery 10.

Step 216: Initial Test?

If the calculated joint resistance is from an initial test, it may be the initial or first joint resistance. However, the calculated joint resistance may be a subsequent or second joint resistance.

Step 218: Store First Joint Resistance.

If the calculated joint resistance is from an initial test, it is then set and stored as the first joint resistance. The calculated first joint resistance may also be associated with an identifier for the weld joint 24 or the battery 10. The identifier may be of a vehicle identification number, a barcode on the multi-cell battery, and a radio-frequency identification unit operatively attached to the multi-cell battery. By associating calculated first joint resistance with the identifier, subsequent calculations may be compared with the first joint resistance.

Step 220: Output or Store Initial Joint Resistance.

The battery 10 may be incorporated into a vehicle that is configured for selective communication with a communications path. The method 200 may include sending a diagnostic message via the communications path. The diagnostic message may include the calculated first joint resistance and the association with the identifier.

The method 200 may also include sending an alert message via the communications path to a receiving point, which is accessible to an operator of the vehicle. The receiving point may be, without limitation, one of a telephone number, a cellular telephone number, an email address, and an instant messaging account. The communications path may include, without limitation, one of a wireless local area network, a cellular network, a Bluetooth protocol, and satellite communications. Therefore, the method 200 may alert the operator of the vehicle of the status of the calculated first joint resistance.

Step 222: Store Second Joint Resistance.

If the calculated joint resistance was not from an initial test, it may be set as the second joint resistance. The second joint resistance may also be stored and associated with the identifier. Furthermore, the method 200 may include re-setting the first joint resistance to the second joint resistance after the method 200 completes, such that future iterations (if any) of the method 200 will use the second joint resistance as a base for calculating fatigue.

Step 224: Determine Cycle Lapse.

The method 200 determines the cycle lapse between calculating the first joint resistance to calculating the second joint resistance. The cycle lapse may be equivalent to the calibrated cycle and may be a lapse of time. Determining the cycle lapse will assist in calculating or estimating a remaining fatigue life or remaining battery life of the weld joint 24 or the battery 10 as a whole.

Step 226: Determine Fatigue Lapse.

The method 200 includes determining the fatigue lapse from the diagnostic message, which may be sent out from the vehicle or may simply be communication of the data needed to calculate the fatigue lapse. The fatigue lapse is the number of fatigue cycles occurring over the lapse of the calibrated cycle. These calculations may be done by the ECU onboard the vehicle, by the control system 50, by an external system reachable through the communications path, or by a testing station or testing device attached to the vehicle.

Step 228: Determine Remaining Fatigue Life.

The method 200 includes estimating the remaining fatigue life based upon a predetermined fatigue life, the determined fatigue lapse, and the cycle lapse. Fatigue life may be determined or calculated based upon time or events occurring in relation to the battery 10. Alternatively, where the remaining fatigue life is calculated away from the vehicle, the method 200 may include sending a diagnostic message via the communications path. The diagnostic message may then be used to calculate the remaining fatigue life. In such a configuration, the diagnostic message may include the calculated first joint resistance, the calculated second joint resistance, and the cycle lapse.

Step 230: Output Calculated Battery Life.

Once the remaining fatigue life for the battery 10 or for the weld joint 24 has been calculated then the method 200 may send a diagnostic message having the remaining fatigue life via the communications path. The remaining fatigue life may be used to alert the operator of the vehicle to the need for replacement of the battery 10.

Figure 5A:
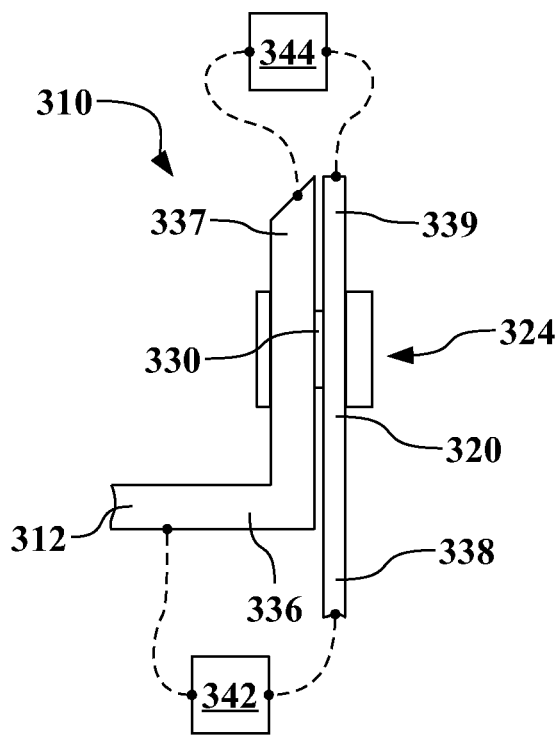
FIG. 5A is a schematic side view of a portion of a mechanical joint, formed by a bolt or rivet.
Figure 5B:
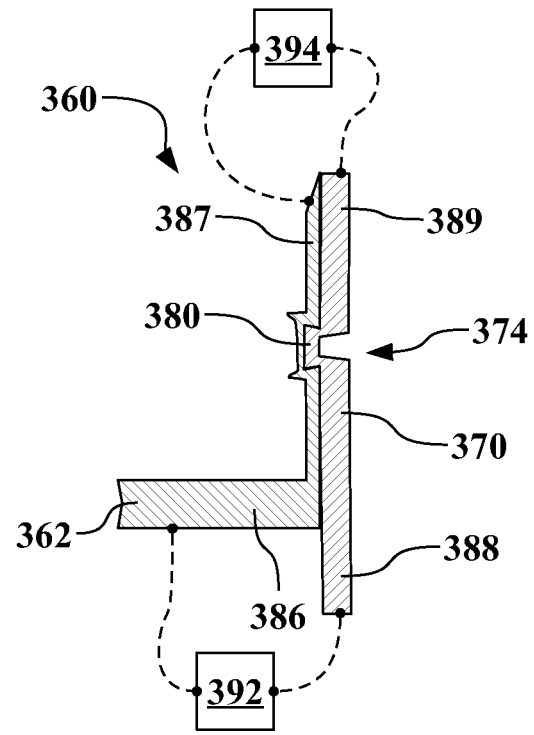
FIG. 5B is a schematic side view of a portion of a mechanical joint, formed by a clinch.

Referring now to FIG. 5A and FIG. 5B, and with continued reference to FIGS. 1-4, there are shown two views of components linked by joints. FIG. 5A shows a side view of a joined component 310 formed by a fastener. FIG. 5B shows a cross-sectional view of a joined component 360 formed by deformation. FIGS. 5A and 5B illustrate additional joint types which may be used with the methods or processes described herein. Features and components shown in other figures may be incorporated and used with those shown in FIGS. 5A and 5B.

FIG. 5A shows the joined component having a first member 312 and a second member 320. The first and second members 312 and 320 are defined on opposing sides of a mechanical joint 324. Unlike the joints shown in FIGS. 1, 2A, and 2B, the mechanical joint 324 joins the first member 312 and the second member 320 with a mechanical fastener 330, which may be, for example and without limitation: a bolt or a rivet.

The first member 312 has a first end 336 and a second end 337 disposed on opposite sides of the first member 312 from the mechanical joint 324. A first end 338 and a second end 339 disposed on opposite sides of the second member 320 from the mechanical joint 324.

The quality or strength of the mechanical joint 324 may be correlated with its resistance or effective resistance. In order to determine the effective resistance of the mechanical joint 324, a current source 342 is in electrical communication with the first end 336 of the first member 312 and the first end 338 of the second member 320. The current source 342 passes a known (or measurable) electrical current through the mechanical joint 324. The current source 342 may include a voltage source and a precision resistor.

A voltmeter 344 measures a voltage differential between the second end 337 of the first member 312 and the second end 339 of the second member 320. From the supplied current and the measured voltage—and the ratio of the voltage to the current—it is possible to calculate the effective resistance of the mechanical joint 324. The calculated resistance may be indicative of the quality of the mechanical joint 324 formed by the mechanical fastener 330.

For example, if the mechanical joint 324 does not provide sufficient contact between second member 320 and the first member 312, flow of the current from the second member 320 to the first member 312 may be impeded, causing the calculated resistance to increase. Furthermore, if the mechanical fastener 330 is broken or has significant cracking, the calculated resistance may also increase greatly.

FIG. 5B shows the joined component having a first member 362 and a second member 370. The first and second members 362 and 370 are defined on opposing sides of a mechanical joint 374. Unlike the joints shown in FIGS. 1, 2A, and 2B, the mechanical joint 374 joins the first member 362 and the second member 370 with a clinching region 380. Alternatively, the clinching region 380 may be replaced with, for example and without limitation, a hemmed region or other mechanical joints.

The first member 362 has a first end 386 and a second end 387 disposed on opposite sides of the first member 362 from the mechanical joint 374. A first end 388 of the second member 370 and a second end 389 of the second member 370 are disposed on opposite sides of the mechanical joint 374.

The quality or strength of the mechanical joint 374 may be correlated with its resistance or effective resistance. In order to determine the effective resistance of the mechanical joint 374, a current source 392 is in electrical communication with the first end 386 of the first member 362 and the first end 388 of the second member 370. The current source 392 passes a known (or measurable) electrical current through the mechanical joint 374. The current source 392 may include a voltage source and a precision resistor.

A voltmeter 394 measures a voltage differential between the second end 387 of the first member 362 and the second end 389 of the second member 370. From the supplied current and the measured voltage, it is possible to calculate the resistance of the mechanical joint 374 and the clinching region 380. The calculated resistance may be indicative of the quality of the mechanical joint 374 formed by the clinching region 380.

For example, if the clinching region 380 does not provide sufficient contact between the second member 370 and the first member 362, flow of the current from the second member 370 to the first member 362 may be impeded, causing the calculated effective resistance to increase. Furthermore, if the clinching region 380 is broken, has significant cracking, or significant separation or gaps, the calculated resistance may also increase greatly.

While the present invention is described in detail with respect to automotive applications, those skilled in the art will recognize the broader applicability of the invention. Those having ordinary skill in the art will recognize that terms such as "above," "below," "upward," "downward," et cetera, are used descriptively of the figures, and do not represent limitations on the scope of the invention, as defined by the appended claims.

While the best modes and other modes for carrying out the claimed invention have been described in detail, those familiar with the art to which this invention relates will recognize various alternative designs and embodiments for practicing the invention within the scope of the appended claims.

The invention claimed is:

1. A method for non-destructive health monitoring of a joined component, comprising:
   supplying a first current between a first end of a first member of the joined component and a first end of a second member of the joined component;
   measuring a first voltage between a second end of the first member and a second end of the second member, wherein the first end of the first member and the first end of second member are situated opposite of at least one joint from the second end of the first member and the second end of the second member;
   calculating a first joint resistance of the at least one joint from the supplied first current and the measured first voltage;
   comparing the calculated first joint resistance to a predetermined minimum joint resistance;
   comparing the calculated first joint resistance to a predetermined maximum joint resistance, wherein the predetermined maximum joint resistance is greater than the predetermined minimum joint resistance; and
   outputting a result of the comparison, wherein the result is one of:
      a measurement error, if the calculated first joint resistance is below the predetermined minimum joint resistance,
      a failed joint, if the calculated first joint resistance is above the predetermined maximum joint resistance, and
      an acceptable joint, if the calculated first joint resistance is above the predetermined minimum joint resistance and below the predetermined maximum joint resistance.

2. The method of claim 1, further comprising:
   starting a counter after calculating the first joint resistance;
   ending the counter after lapse of a calibrated cycle;
   supplying a second current between the first end of the first member and the first end of the second member;
   measuring a second voltage between the second end of the first member and the second end of the second member;
   calculating a second joint resistance of the at least one joint from the supplied second current and the measured second voltage, wherein the second joint resistance is calculated following lapse of the calibrated cycle;
   comparing the second joint resistance to the first joint resistance; and
   determining a fatigue lapse occurring over the calibrated cycle between the first joint resistance and the second joint resistance.

3. The method of claim 2, further comprising:
   estimating a remaining joint life based upon a predetermined fatigue life, the determined fatigue lapse, and the calibrated cycle.

4. The method of claim 3, wherein the at least one joint is a weld joint of a multi-cell battery, and further comprising:
   associating the calculated first joint resistance with an identifier for the weld joint.

5. The method of claim 4, wherein the identifier is one of a vehicle identification number, a barcode on the multi-cell battery, and a radio-frequency identification unit operatively attached to the multi-cell battery.

6. The method of claim 5, wherein the multi-cell battery is incorporated into a vehicle and the vehicle is configured for selective communication with a communications path, and further comprising:
   sending a diagnostic message via the communications path, wherein the diagnostic message includes one of the determined remaining fatigue life and the determined fatigue lapse.

7. The method of claim 6, further comprising:
   sending an alert message via the communications path to a receiving point, wherein the receiving point is accessible to an operator of the vehicle.

8. The method of claim 7, wherein the receiving point is one of a telephone number, a cellular telephone number, an email address, and an instant messaging account.

9. The method of claim 8, wherein the communications path includes one of a wireless local area network, a cellular network, a Bluetooth protocol, and satellite communications.

10. The method of claim 4, wherein the multi-cell battery is incorporated into a vehicle, and wherein supplying the first current occurs during operation of the vehicle.

11. The method of claim 4, wherein the multi-cell battery is incorporated into a vehicle, and wherein supplying the first current occurs during one of maintenance of the vehicle and service of the vehicle.

12. The method of claim 3, wherein the at least one joint is a mechanical joint, including one of a bolt, a rivet, a clinch, and a hem, and wherein the first joint resistance is the resistance of the mechanical joint.

13. A method for non-destructive health monitoring of a multi-cell battery, comprising:
   supplying a first current between a first end of a bus member and a first end of a tab stack;
   measuring a first voltage between a second end of the bus member and a second end of the tab stack, wherein the bus member and the tab stack form a battery joint, and the first ends of the bus member and the tab stack are oriented opposite of a plurality of weld joints from the second ends of the bus member and the tab stack;
   calculating a first joint resistance of the plurality of weld joints from the supplied first current and the measured first voltage;
   associating the calculated first joint resistance with an identifier for the plurality of weld joints and
   calculating a second joint resistance of the plurality of weld joints from a supplied second current and a measured second voltage, wherein the second joint resistance is calculated following a time lapse after calculating the first joint resistance.

14. The method of claim 13, wherein the multi-cell battery is incorporated into a vehicle and the vehicle is configured for selective communication with a communications path, and further comprising:
   sending a diagnostic message via the communications path, wherein the diagnostic message includes the calculated first joint resistance, the calculated second joint resistance, and the time lapse.

15. The method of claim 14, further comprising:
   analyzing the diagnostic message at a location other than the vehicle; and
   determining a fatigue lapse from the diagnostic message, wherein the fatigue lapse is the number of fatigue cycles occurring over the time lapse.

16. The method of claim 15, further comprising:
   estimating a remaining fatigue life based upon a predetermined fatigue life, the determined fatigue lapse, and the time lapse.

17. The method of claim 16, wherein supplying the first current occurs during operation of the vehicle.

18. The method of claim 16, wherein supplying the first current occurs during charging of the multi-cell battery.

* * * * *